United States Patent
Wakita et al.

(10) Patent No.: US 6,540,828 B2
(45) Date of Patent: Apr. 1, 2003

(54) METHOD FOR PRODUCING CRYSTALLINE SILICON

(75) Inventors: Saburo Wakita, Omiya (JP); Yoshinobu Nakada, Omiya (JP); Junichi Sasaki, Omiya (JP); Yuji Ishiwari, Omiya (JP)

(73) Assignee: Mitsubishi Materials Corporation, Tokyo (JP)

(*) Notice: Subject to any disclaimer, the term of this patent is extended or adjusted under 35 U.S.C. 154(b) by 0 days.

(21) Appl. No.: 10/103,797

(22) Filed: Mar. 25, 2002

(65) Prior Publication Data

US 2002/0139297 A1 Oct. 3, 2002

Related U.S. Application Data

(62) Division of application No. 09/551,568, filed on Apr. 18, 2000, now Pat. No. 6,383,285.

(30) Foreign Application Priority Data

Apr. 30, 1999 (JP) .......................... 11-125339
Feb. 29, 2000 (JP) ........................... 2000-054820

(51) Int. Cl.[7] ............................................ C30B 25/02
(52) U.S. Cl. ........................ 117/206; 117/200; 117/204; 117/900
(58) Field of Search .......................... 117/200, 204, 117/206, 900

(56) References Cited

FOREIGN PATENT DOCUMENTS

| EP | 0 867 405 | 9/1998 |
|---|---|---|
| EP | 0 887 442 | 12/1998 |
| WO | WO 98/16466 | 4/1998 |

*Primary Examiner*—Felisa Hiteshew
(74) *Attorney, Agent, or Firm*—Oblon, Spivak, McClelland, Maier & Neustadt, P.C.

(57) ABSTRACT

A simple and inexpensive method and apparatus for producing crystalline silicon comprising the steps of melting silicon in a mold, then cooling the bottom of the mold is cooled to create a positive temperature gradient from the bottom of the mold upward, thereby causing the molten silicon to crystallize from the inner bottom of the mold upward so that the solid-liquid phase boundary, separating the crystallized silicon from the molten silicon, moves upward as the molten silicon crystallizes. As the silicon crystallizes, an inert gas is blown onto the surface of the molten silicon from a position above the surface of the molten silicon, thereby vibrating the surface of the molten silicon in such a manner that cavities are formed in the surface of the molten silicon.

12 Claims, 3 Drawing Sheets

METHOD FOR PRODUCING CRYSTALLINE SILICON

BACKGROUND OF THE INVENTION

1. Field of the Invention

The present invention is a method of producing crystalline silicon by cooling and solidifying molten silicon gradually in a unidirectional manner.

2. Discussion of the Background

Polycrystalline silicon solar cells are the type of solar cells which are presently produced in the largest quantity. The performance of a polycrystalline silicon solar cell element depends greatly on the quality of the polycrystalline silicon. For this reason, various improvements have been made in methods for producing polycrystalline silicon, particularly in methods to decrease the level of impurities and to improve the crystallinity of the polycrystalline silicon Methods for producing polycrystalline silicon are roughly divided into two steps: a step in which high-purity silicon is produced from metallic silicon, and a step of solidifying molten high-purity silicon by a unidirectional solidification process. In conventional processes, in order to reduce the level of impurity elements in the silicon, metallic silicon is reacted with hydrochloric acid to obtain gaseous trichlorosilane, followed by rectifying the gaseous trichlorosilane and then precipitating high-purity silicon from the gas while reducing the rectified gas with hydrogen gas, thereby forming high-purity silicon. Alternatively, or in addition, the level of impurities in the silicon may also be reduced by stirring the molten silicon during the unidirectional solidification step.

For example, the following methods are disclosed for stirring molten silicon. JP-A 61-141612 discloses a method of turning a mold containing the molten silicon, JP-A 5-254817 discloses a method of stirring molten silicon by means of a magnetic field and JP-A 10-182135 discloses a method which comprises blowing an inert gas into the molten silicon by inserting a gas-supplying lance into the molten silicon above the solid-liquid phase boundary between the molten and solid silicon.

However, the above-mentioned first method requires expensive equipment, has a high production cost, and requires difficult and costly equipment maintenance. The second method requires expensive equipment. The third method has the problem that the gas-supplying lance tends to melt and deposit impurities into the molten silicon, resulting in less pure silicon.

The properties of solar cells made from silicon having a high oxygen content are poorer than those of solar cells made from silicon having a lower oxygen content. A certain level of oxygen is dissolved or otherwise incorporated into remelted, lump silicon derived from single crystal silicon scrap, which is a convenient main raw material. It is therefore necessary to decrease the oxygen level in the silicon during the process of melting and unidirectional solidification. Furthermore, when the surface of molten silicon is not covered by an inert gas, a carbon oxide gas (CO), silicon oxide gas (SiO) and the like are absorbed into the molten silicon, thereby increasing the level of carbon and oxygen impurities therein, which results in a degradation of the properties of the resulting solar cells. As defined herein, carbon oxide gas includes any gaseous oxide of carbon, for example carbon monoxide or carbon dioxide, or mixtures thereof, and silicon oxide gas includes any oxide of silicon, for example, silicon dioxide.

SUMMARY OF THE INVENTION

The present invention is a method for producing high quality polycrystalline silicon at a low cost, which has low impurity levels and high crystallinity. The following aspects of the present invention further describe the present invention:

(1) The first aspect of the present invention is a process for producing crystalline silicon in which molten silicon crystallizes upward from the inner bottom of a mold by means of a positive temperature gradient extending from the inner bottom of the mold upward, in which the temperature of the silicon increases from the bottom of the mold, upward. During the crystallization of the silicon, an inert gas, such as argon (Ar) is blown onto the surface of the molten silicon from a position above the surface of the molten silicon, in order to vibrate the surface of the molten silicon in such a manner that cavities are formed in the surface. Consequently, the vibration continuously forms a fresh surface on the molten silicon which promotes the discharge to the surrounding atmosphere of SiO gas generated in the interior of the molten silicon, which is effective in removing oxygen (O) impurities in the molten silicon. In addition, because a gas-supplying lance is not inserted into the molten silicon, there is less chance of contaminating the molten silicon with impurities derived from the gas-supplying lance.

(2) The second aspect of the present invention is a process for producing crystalline silicon as mentioned in (1), in which the surface of the molten silicon is covered with an inert gas. By covering the surface of the molten silicon with an inert gas such as Ar, contaminating gases such as CO gas and SiO gas from the surrounding atmosphere are not absorbed by the molten silicon.

(3) The third aspect of the present invention is a process for producing crystalline silicon as mentioned in (1) or (2), in which a susceptor is located above the surface of the molten silicon and the inert gas is introduced into the space between the susceptor and molten silicon through an opening in the susceptor. The inert gas present near the surface of the molten silicon is restrained from diffusing into the surrounding atmosphere by the susceptor, so the inert gas can cover the surface of the molten silicon for a long time. Therefore, the CO gas and SiO gas in the surrounding atmosphere are effectively prevented from entering into the molten silicon by a small flow rate of an inert gas.

(4) The fourth aspect of the present invention is a process for producing crystalline silicon as mentioned in any one of (1) to (3), in which the flow rate of the inert gas blown into the mold is reduced as the solid-liquid phase boundary of the silicon in the mold moves upward. This prevents the solid-liquid phase boundary from being disturbed by the blown inert gas.

(5) The fifth aspect of the present invention is a process for producing crystalline silicon as mentioned in any one of (1) to (4), in which the flow rate of the inert gas blown into the mold, the inside radius of the gas-supplying lance which introduces the inert gas onto the surface of the molten silicon, and the distance from a nozzle of the lance to the surface of the molten silicon satisfy the following formula;

$$3 \leq f/(rH) \leq 60$$

where
 f (in units of l/min) is the flow rate of the inert gas;
 r (in units of cm) is the inside radius of the lance; and
 H (in units of cm) is the distance from a port of the lance to the surface of molten silicon.

The flow rate of the blown gas, the inside radius of the gas-supplying lance and the distance from a port of the lance to the surface of the molten silicon are conditions selected so that the surface of the molten silicon is vibrated effectively, promoting the discharge to the surrounding atmosphere of SiO gas generated in the interior of the molten silicon. Therefore, the level of O impurities in the molten silicon can be reduced.

(6) The sixth aspect of the present invention is a process for producing crystalline silicon as mentioned in any one of (1) to (5), in which there are one or more gas nozzles on the lance, and the number of nozzles increases as the surface area of the molten silicon increases.

In the above-mentioned method for producing crystalline silicon, the surface of the molten silicon is vibrated by the lance nozzles, the number of which is selected according to the surface area of the molten silicon, so as to effectively promote the discharge to the surrounding atmosphere of SiO gas generated in the interior of the molten silicon. This causes a reduction in the O impurity level in the molten silicon.

BRIEF DESCRIPTION OF THE DRAWINGS

FIG. 4($b$) is a plan view of FIG. 4($a$) which illustrates the inert gas flow.

DETAILED DESCRIPTION OF THE INVENTION

Preferred embodiments of the method of the present invention for producing crystalline silicon are described hereinafter with reference to the drawings.

Figure 1:
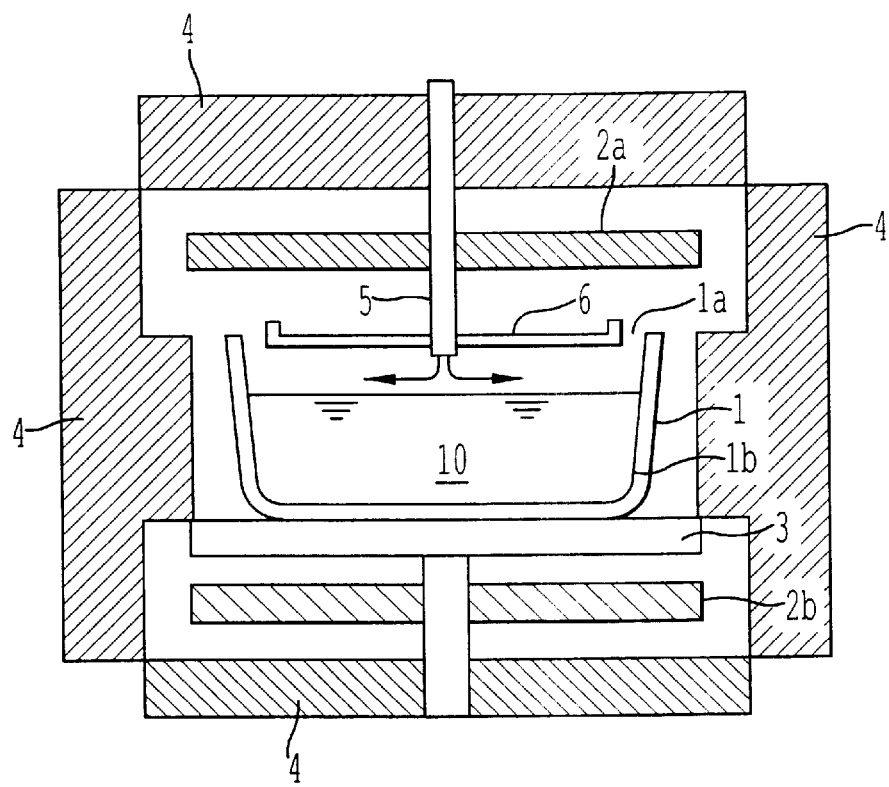
FIG. 1 is a schematic sectional view showing an apparatus consisting of a mold, heaters, a cooling plate, a susceptor, and thermal insulation which is used for producing crystalline silicon according to the present invention.

The entire apparatus illustrated in FIG. 1 is located within a large chamber, not shown in the drawing. As shown in FIG. 1, a solid silicon raw material is charged into mold 1. Next, an inert gas atmosphere is introduced from the upper part of the chamber holding the apparatus of FIG. 1. The solid silicon in the mold is then heated by the upper heater 2$a$ and lower heater 2$b$ to melt the solid silicon, providing molten silicon 10. Next, an inert gas, for example Ar gas, supplied from the gas-supplying lance 5, covers the surface of the molten silicon. The flow pattern of the inert gas is illustrated by the arrow symbols in FIG. 2. The inert gas provided by the lance vibrates the surface of the molten silicon so that cavities are formed in the molten silicon surface. Subsequently the lower heater 2$b$ is turned off, and the cooling of the molten silicon in the mold by means of chill plate 3, at the bottom of the mold, 1$b$, is begun. The molten silicon is thus unidirectionally crystallized along a positive temperature gradient formed from the bottom part of the mold, 1$b$, upward. A positive temperature gradient is a temperature gradient in which the temperature of the mold and the silicon therein increases from the bottom to the top of the mold.

As mentioned above, as the Ar gas is blown down onto the surface of the molten silicon by the gas-supplying lance, the surface of the molten silicon vibrates so that a fresh surface is continually formed in the surface of the molten silicon. This promotes the exhaust of the SiO gas to the surrounding atmosphere from the interior of the molten silicon with the result that O impurities can be effectively removed. In addition, the contamination of the molten silicon by CO gas from the surrounding atmosphere is prevented by this flow of inert gas. As a result of solidifying the silicon under these conditions, an ingot of crystalline silicon having a low level of impurities such as C and O is obtained. Furthermore, this crystalline silicone has excellent crystallinity.

Furthermore, as the opening of the mold, 1$a$, is almost entirely covered by the susceptor 6, CO gas and SiO gas are prevented from being absorbed by the molten silicon because the inert gas supplied by the gas-supplying lance covers the surface of the molten silicon.

Moreover, using the method of the present invention, crystalline silicon is obtained at a low cost, as it is sufficient that the lance is positioned above the mold so as to blow the inert gas onto the surface of the molten silicon.

Figure 2:
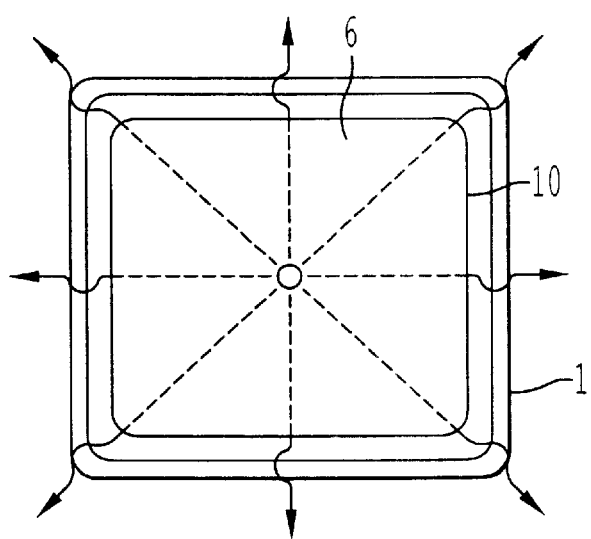
FIG. 2 is a plan view of FIG. 1, viewed from the perspective of a gas-supplying lance, and which illustrates the inert gas flow.

In order to deoxidize the molten silicon, it is necessary to provide a gas flow pattern like that shown in FIG. 2, in which the opened part of the mold, 1$a$, is not completely closed off.

Figure 3A:
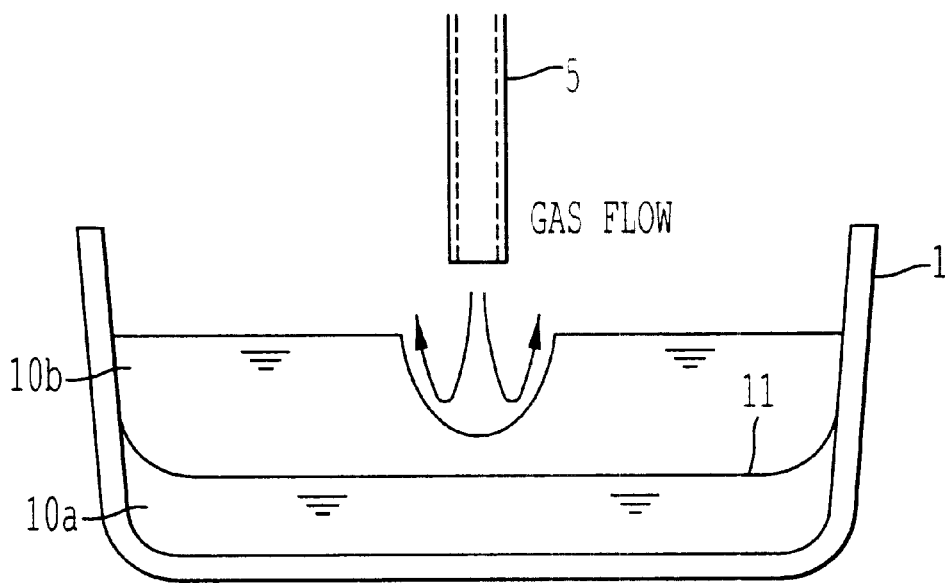
FIG. 3($a$) and ($b$) show the relation between the rate of inert gas flow and the position of the solid-liquid phase boundary.
Figure 3B:
Figure 3B:
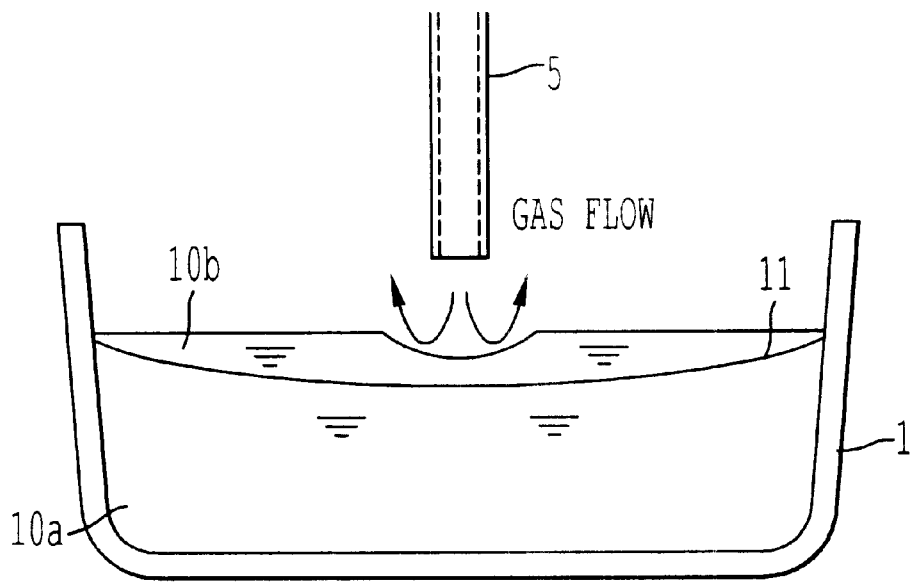

FIGS. 3($a$) and ($b$) shows the relationship between the flow rate of the inert gas and the position of the solid-liquid phase boundary, 11. When the solid-liquid phase boundary is near the bottom of the mold, as in FIG. 3($a$), the rate of flow of the inert gas directed out of the lance 5, onto the molten silicon, 10$b$ is high. As the solid-liquid phase boundary rises due to the crystallization of the solid silicon, 10$a$, the rate of inert gas flow out of the lance is reduced, so as not to disturb the solid-liquid phase boundary.

FIGS. 4($a$) and 4($b$) illustrates a schematic of an alternative apparatus in which an oval or round susceptor 6 is placed directly on top of a square or rectangular mold 1, so that the inert gas flow can escape through the opening between the mold and the susceptor. Of course, any shape of mold and susceptor is acceptable as long as the inert gas from the lance can fill the space between the susceptor and the surface of the molten silicon, and the inert gas can flow out of the mold.

Having generally described this invention, a further understanding can be obtained by reference to certain specific examples which are provided herein for purposes of illustration only, and are not intended to be limiting unless otherwise specified.

EXAMPLES

Ingots of crystalline silicon were produced using the above-described apparatus for producing crystalline silicon according to the present invention. A quartz mold was used having a dimension of about 17×17×11 (cm). Approximately 3 kg of scrap single crystal silicon used for semiconductors was used as the solid silicon raw material. The silicon was heated up to 1500° C. in one hour, and the silicon was completely melted in 1.5 hours. After the silicon was completely melted, the required inert gas flow was begun. Ar gas atmosphere was used in the chamber.

The gas-supplying lance was arranged at various heights above the molten silicon surface, as follows: H=1.0, 5.0, 12.0 and 20 cm, as measured from the surface of the molten silicon to the head of the lance. The Ar gas was blown onto the surface of the molten silicon at various flow rates as follows: 2, 10, 40 and 60 l/min. The gas-supplying lances were used which had the following inside radii (r):r=0.25, 0.5 cm.

The gas flow rate was successively decreased as the solid-liquid phase boundary moved upward. Accordingly, the solid-liquid phase boundary was not disturbed with the result that crystalline silicon having excellent crystallinity was produced.

As a comparative example, the following case was carried out.

| | |
|---|---|
| Inside radius of gas-supplying lance: | r = 0.25 cm |
| Position of lance: | 300 mm obliquely upward from the surface of molten silicon |
| Gas flow rate: | 10 l/min |

The C and O impurity levels of the silicon ingots obtained as described above are shown in Table 1.

under conditions satisfying the relation $3 > f/(rH)$. Under conditions satisfying the relation $f/(rH) > 25$, although the C and O impurity levels decrease further, the crystallinity of the silicon was disturbed and the solar cell properties were reduced because it was difficult to control the process such that the solid-liquid phase boundary was not disturbed.

As shown by the examples above, the C and O impurity levels of crystalline silicon prepared by the process of the present invention are lower than those of the comparative example when the process conditions satisfy the relation $3.0 \leq f/(rH) \leq 60$. In particular, when the process conditions satisfy the relation $5.0 \leq f/(rH) \leq 25$, the C and O impurity levels are greatly reduced.

When gas-supplying lances having a larger radius, r, are employed, the impurity levels increase. If r is larger than 3 cm, the impurity levels are the same as that of the comparative example.

TABLE 1

C and O Impurity Levels at 2.0 cm from the Bottom of the silicon Ingot after Casting

| | The Present Invention | | | | | | | | Comparative Example |
|---|---|---|---|---|---|---|---|---|---|
| | r = 0.25 | | | | r = 0.5 | | | | |
| | f | | | | f | | | | r = 0.25 |
| H | 2 | 10 | 40 | 60 | H | 2 | 10 | 40 | 60 | f = 10 |

C Impurity Level ($\times 10^{16}$ atom/cc)

| 1.0 | 41.3$^a$\8 | 36.5$^b$\40 | *\180 | *\240 | 1.0 | 45.8$^b$\4 | 35.4$^a$\50 | *\80 | *\120 | 92.4 |
| 5.0 | 70.2\1.6 | 40.3$^a$\8 | 33.2$^b$\32 | 31.4$^b$\48 | 5.0 | 76.7\0.8 | 49.1$^b$\4 | 37.3$^a$\16 | 34.6$^a$\24 | The position of a port |
| 12 | 82.1\0.7 | 54.2$^a$\3.3 | 35.2$^a$\13 | 34.3$^a$\20 | 12 | 85.4\0.3 | 62.1\1.7 | 38.2$^a$\6.7 | 36.5$^a$\10 | of lance is at 30 cm |
| 20 | 85.0\0.4 | 68.0\2 | 42.6$^a$\8 | 39.1$^a$\12 | 20 | 90.5\0.2 | 78.2\1 | 50.6\4 | 44.1$^a$\6 | obliquely upward from the surface of molten silicon |

O Impurity Level ($\times 10^{18}$ atom/cc)

| 1.0 | 1.09$^a$\8 | 0.85$^b$\40 | *\180 | *\240 | 1.0 | 1.35$^b$\4 | 0.95$^a$\50 | *\80 | *\120 | 2.05 |
| 5.0 | 1.75\1.6 | 1.12$^a$\8 | 0.82$^b$\32 | 0.78$^b$\48 | 5.0 | 1.84\0.8 | 1.24$^b$\4 | 1.02$^a$\16 | 0.86$^a$\24 | The position of a port |
| 12 | 1.94\0.7 | 1.36$^a$\3.3 | 1.03$^a$\13 | 0.96$^a$\20 | 12 | 1.97\0.3 | 1.81\1.7 | 1.19$^a$\6.7 | 1.05$^a$\10 | of lance is at 30 cm |
| 20 | 2.05\0.4 | 1.81\2 | 1.11$^a$\8 | 1.07$^a$\12 | 20 | 2.04\0.2 | 1.88\1 | 1.28$^b$\4 | 1.21$^a$\6 | obliquely upward from the surface of molten silicon |

$^a$Conditions satisfying $5.0 \leq f/(rH) \leq 25$
$^b$Conditions satisfying $3.0 \leq f/(rH) \leq 60$
*Casting is impossible as there is a high possibility of splashing of molten silicon.

The height of the ingots obtained as described above were about 5 cm. With regard to both the examples of the present invention and the comparative example, C and O contents were measured in the center of the face of a wafer obtained at a height of 2.0 cm from the bottom of each ingot.

In Table 1, the "a" superscript indicates that the conditions satisfied the relation $5.0 \leq f/(rH) \leq 25$ and the superscript "b" indicates that the conditions satisfied the relation $3.0 \leq f/(rH) \leq 60$. The asterisk symbol "*" indicates conditions in which molten silicon splashed and sputtered to the upper heater. The upper half of Table 1 shows the C impurity level and the lower half shows the O impurity level. The numeral located on the left side of the slash "\" is the value of the impurity level, while the numeral located to the right of the slash "\" is the value of the relation $f/(rH)$.

Figure 4A:
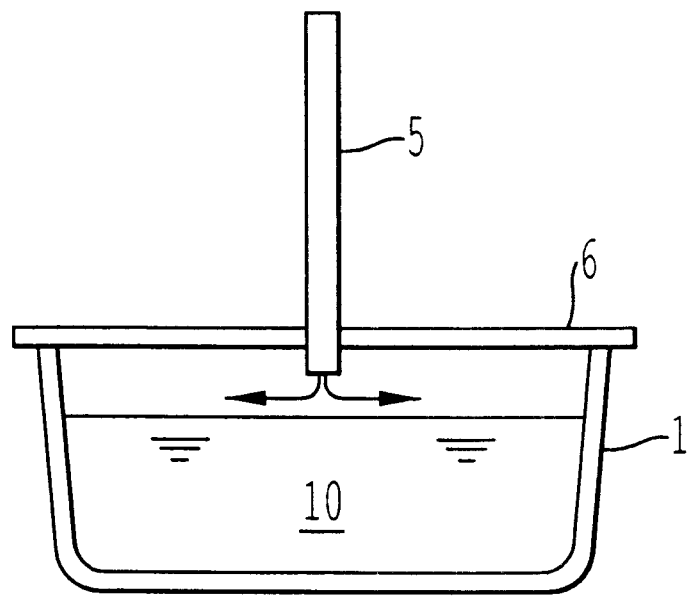
FIG. 4($a$) is a schematic sectional view of another example of a mold and a susceptor for producing crystalline silicon according to the present invention.
Figure 4B:
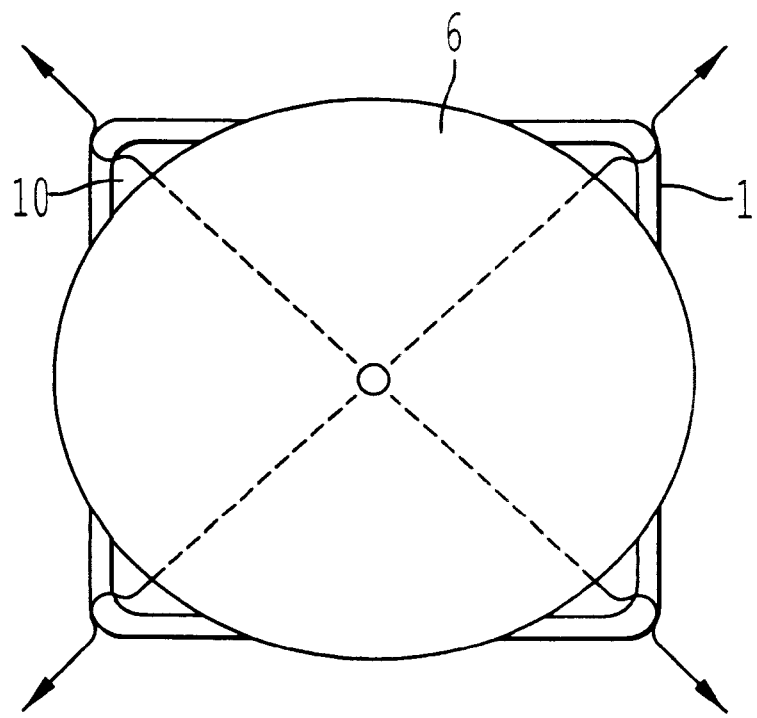

Under conditions satisfying the relationship $3 > f/(rH)$, both the C and O impurity levels are high. In contrast, under conditions satisfying the relation $3 \leq f/(rH) \leq 5$, the C and O impurity levels are lower. Under conditions satisfying the relation $5.0 \leq f/(rH) \leq 25$, the C and O impurity levels decrease to approximately half that of silicon produced As shown in FIGS. 4(a) and 4(b), the susceptor may have a diameter larger than the width of the opening of the mold and can be placed directly on top of the opening of the mold.

A plurality of lances may be used if the surface are of the molten silicon is large. For example, a small mold in which the surface area of the molten silicon is correspondingly small may only require only one gas-supplying lance to effectively vibrate the molten silicon surface, and thereby exhaust the SiO gas generated in the interior of the molten silicon. Larger molds, in which the surface area of the molten silicon is correspondingly larger, may require two or more gas-supplying lances in order to prepare high-purity silicon according to the present invention.

As described in detail above, the following results are obtained when using the method of the present invention for producing crystalline silicon:

(1) The first aspect of the present invention is a process for producing crystalline silicon which has low impurity levels and excellent crystallinity, since the solidification and crystallization of the silicon are carried out while simultaneously removing O impurities from the molten silicon by promoting the discharge to the surrounding atmosphere of SiO gas which was generated in the interior of the molten silicon during the crystallization.

(2) The second aspect of the present invention is a process for producing a crystalline silicon, in which impurity gases such as CO gas and SiO gas from the surrounding atmosphere are prevented from being absorbed by the molten silicon.

(3) The third aspect of the present invention is a process for producing crystalline silicon, in which CO gas and SiO gas from the surrounding atmosphere are effectively prevented from being absorbed by the molten silicon by providing a small flow rate of an inert gas over the surface of the molten silicon.

(4) The fourth aspect of the present invention is a process for producing crystalline silicon, in which the solid-liquid phase boundary is not disturbed by by reducing the flow rate of the inert gas as crystallization proceeds, with the result that a crystalline silicon having an excellent crystallinity is obtained.

(5) The fifth aspect of the present invention is a process for producing crystalline silicon having a greatly reduced level of O impurities which is produced by vibrating the surface of the molten silicon by selecting a flow rate of the inert gas, the inside radius of the gas-supplying lance and the distance from a port of the lance to the surface of the molten silicon in order to promote the discharge to the surrounding atmosphere, of SiO gas generated in the interior of the molten silicon, thereby removing O impurities in the molten silicon.

(6) The sixth aspect of the present invention is a process for producing crystalline silicon in which the level of O impurities can be reduced by vibrating the molten silicon by a number of lances, in which the number of lances employed depends on the surface area of the molten silicon, so that the SiO gas generated in the interior of the molten silicon is effectively discharged to the surrounding atmosphere.

The priority documents of the present application, Japanese patent application 11-125339 filed Apr. 30, 1999, and Japanese patent application 2000-054820 filed Feb. 29, 2000, are incorporated herein by reference.

Obviously, numerous modifications and variations on the present invention are possible in light of the above teachings. It is therefore to be understood that within the scope of the appended claims, the invention may be practiced otherwise than as specifically described herein.

What is claimed is:

1. An apparatus for preparing polycrystalline silicon comprising:
   a mold having an open top;
   one or more heaters disposed above the open top of the mold;
   one or more heaters disposed below a bottom of the mold;
   a cooling plate disposed below the bottom of the mold;
   a lance disposed above the open top of the mold, having one or more nozzles through which an inert gas can blow down onto the open top of the mold.

2. The apparatus of claim 1, further comprising a planar susceptor disposed horizontally above the open top of the mold so that one or more openings between the top of the mold and an edge of the susceptor are provided, wherein the lance extends through an opening in the susceptor, and inert gas flowing through the lance blows down onto the open top of the mold and flows out through the one or more openings between top of the mold and the edge of the susceptor.

3. The apparatus of claim 2, wherein the susceptor, when viewed from the direction of the open top of the mold, is circular or oval.

4. The apparatus of claim 1, wherein the mold, viewed from the direction of the open top, is rectangular.

5. The apparatus of claim 1, wherein the one or more nozzles provide a flow pattern of the inert gas which extends radially outward from the center of the mold.

6. The apparatus of claim 1, wherein the lance is disposed above the surface of the mold so that the head of the lance is 1.0 to 20 cm above the surface of molten silicon in the mold.

7. The apparatus of claim 1, wherein the lance has an inside radius of 0.25 to 0.5 cm.

8. An apparatus for preparing polycrystalline silicon comprising:
   a mold having an open top;
   one or more heating means disposed above the open top of the mold;
   one or more heating means disposed below a bottom of the mold;
   cooling means disposed below the bottom of the mold; and
   means for blowing inert gas down on the open top of the mold disposed above the open top of the mold.

9. The apparatus of claim 8, further comprising a planar susceptor disposed horizontally above the open top of the mold so that one or more openings between the top of the mold and an edge of the susceptor are provided, wherein the means for blowing inert gas extends through an opening in the susceptor, and inert gas blows down onto the open top of the mold and flows out through the one or more openings between top of the mold and the edge of the susceptor.

10. The apparatus of claim 8, wherein the mold, viewed from the direction of the open top, is rectangular.

11. The apparatus of claim 8, wherein the susceptor, viewed from the direction of the open top of the mold, is circular or oval.

12. The apparatus of claim 8, wherein the means for blowing inert gas provides a flow pattern of the inert gas which extends radially outward from the center of the mold.

* * * * *